(12) United States Patent
Forte et al.

(10) Patent No.: US 8,564,468 B2
(45) Date of Patent: Oct. 22, 2013

(54) SEQUENCE ARBITER FOR ANALOG-TO-DIGITAL CONVERSIONS

(75) Inventors: Gianluigi Forte, Camporotondo Etneo (IT); Stello Matteo Bille', Catania (IT); Dino Costanzo, Catania (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/467,564

(22) Filed: May 9, 2012

(65) Prior Publication Data

US 2012/0299760 A1    Nov. 29, 2012

(30) Foreign Application Priority Data

May 24, 2011  (IT) .............................. MI2011A0926

(51) Int. Cl.
*H03M 1/12*    (2006.01)
(52) U.S. Cl.
USPC .......................................... 341/155; 341/141
(58) Field of Classification Search
USPC .................................................. 341/141, 155
See application file for complete search history.

(56) References Cited

U.S. PATENT DOCUMENTS

| | | | |
|---|---|---|---|
| 5,168,276 A | 12/1992 | Huston et al. | |
| 6,433,716 B2 * | 8/2002 | Arai et al. | 341/141 |
| 6,486,809 B1 | 11/2002 | Figoli | |
| 6,507,298 B1 * | 1/2003 | Barrenscheen et al. | 341/141 |
| 6,653,963 B1 * | 11/2003 | Barrenscheen et al. | 341/155 |
| 7,212,143 B1 * | 5/2007 | Confalonieri et al. | 341/155 |

* cited by examiner

*Primary Examiner* — Khai M Nguyen
(74) *Attorney, Agent, or Firm* — Allen, Dyer, Doppelt, Milbrath & Gilchrist, P.A.

(57) ABSTRACT

An analog-to-digital converter device may include an input multiplexer circuit having analog input terminals configured to receive a respective plurality of analog input signals. The input multiplexer circuit may be responsive to a first select input. The device may also include a trigger multiplexer circuit having input terminals configured to receive respective triggering signals. The trigger multiplexer circuit may be responsive to a second select input. Analog-to-digital converter circuitry may be configured to convert the selected analog signal into a digital signal. A sequence arbiter may be coupled to the first and second select inputs and may have input terminals configured to receive a respective plurality of conversion sequence configuration signals. The sequence arbiter may be configured to manage each conversion sequence of the analog-to-digital converter circuitry based upon the relative conversion sequence configuration signal received, and control the conversion sequences.

18 Claims, 5 Drawing Sheets

| | priority | length | pAinBuffer | pTrBuffer | pResults | Str | KI | mode |
|---|---|---|---|---|---|---|---|---|
| Sc1 | priority1 | length1 | pAinBuffer1 | pTrBuffer1 | pResults1 | Str1 | KI1 | mode1 |
| Sc2 | priority2 | length2 | pAinBuffer2 | pTrBuffer2 | pResults2 | Str2 | KI2 | mode2 |
| ... | | | | | | | | |
| Scn | priorityn | lengthn | pAinBuffern | pTrBuffern | pResultsn | Strn | KIn | moden |

Fig.3

SEQUENCE ARBITER FOR ANALOG-TO-DIGITAL CONVERSIONS

FIELD OF THE INVENTION

The present invention relates to a sequence arbiter for analog-to-digital conversions.

BACKGROUND OF THE INVENTION

Analog-to-digital converters (ADC) are well known in the art and are commonly used to convert an analog signal into a digital representation by periodically sampling the analog signal to form a sequence of digital values. A simple ADC generally provides a low resolution digital representation for each sample, such as an eight bit value, for example. More complex ADCs provide higher accuracy values, such as a sixteen bit value. ADCs may be included in a single apparatus with a microprocessor configured to control the ADC by software executed on it.

The need for ADCs is rapidly increasing in modern electronic applications, especially in motor control devices. The number of available ADCs may be lower than the number desired.

Also the available ADCs may be desirably managed on the basis of a priority request. The ADC converter may comprise a sequencer arbiter to manage the priority of conversion requests.

SUMMARY OF THE INVENTION

In view of the state of the art, an object of the present invention is to provide a sequence arbiter for analog-to-digital conversions which allows management of the conversion requests in a different manner from prior art. According to the present invention, this object is achieved by an analog-to-digital converter apparatus comprising an input multiplexer circuit having a plurality of analog input terminals for receiving a respective plurality of analog input signals. The input multiplexer circuit is responsive to a select input.

The apparatus also includes a trigger multiplexer circuit having a plurality of input terminals for receiving a respective plurality of triggering signals. The trigger multiplexer circuit is responsive to a select input. The apparatus also includes analog-to-digital converter circuitry configured to convert the selected analog signal into a digital signal, and a sequence arbiter connected to the select inputs of the input multiplexer circuit and the trigger multiplexer circuit. The sequence arbiter has a plurality of input terminals for receiving a respective plurality of conversion sequence configuration signals.

The sequence arbiter is configured to manage each conversion sequence of the analog-to-digital converter circuitry based upon the relative conversion sequence configuration external signal. The sequence arbiter is configured to control the interruption of the actual conversion sequence in progress, and to control the start of a new conversion sequence, relative to the new conversion sequence configuration signal received by outside, by placing the actual conversion sequence in a waiting condition, if the new conversion sequence has a higher priority than the actual conversion sequence. Alternatively, the sequence arbiter may postpone the start of the new conversion sequence, placing it in the waiting condition, if the actual conversion sequence has a higher priority than the new conversion sequence.

BRIEF DESCRIPTION OF THE DRAWINGS

FIG. 3 is a diagram of sequence configuration signals used in the analog-to-digital converter apparatus of FIG. 1.

DETAILED DESCRIPTION OF THE PREFERRED EMBODIMENTS

Figure 1:
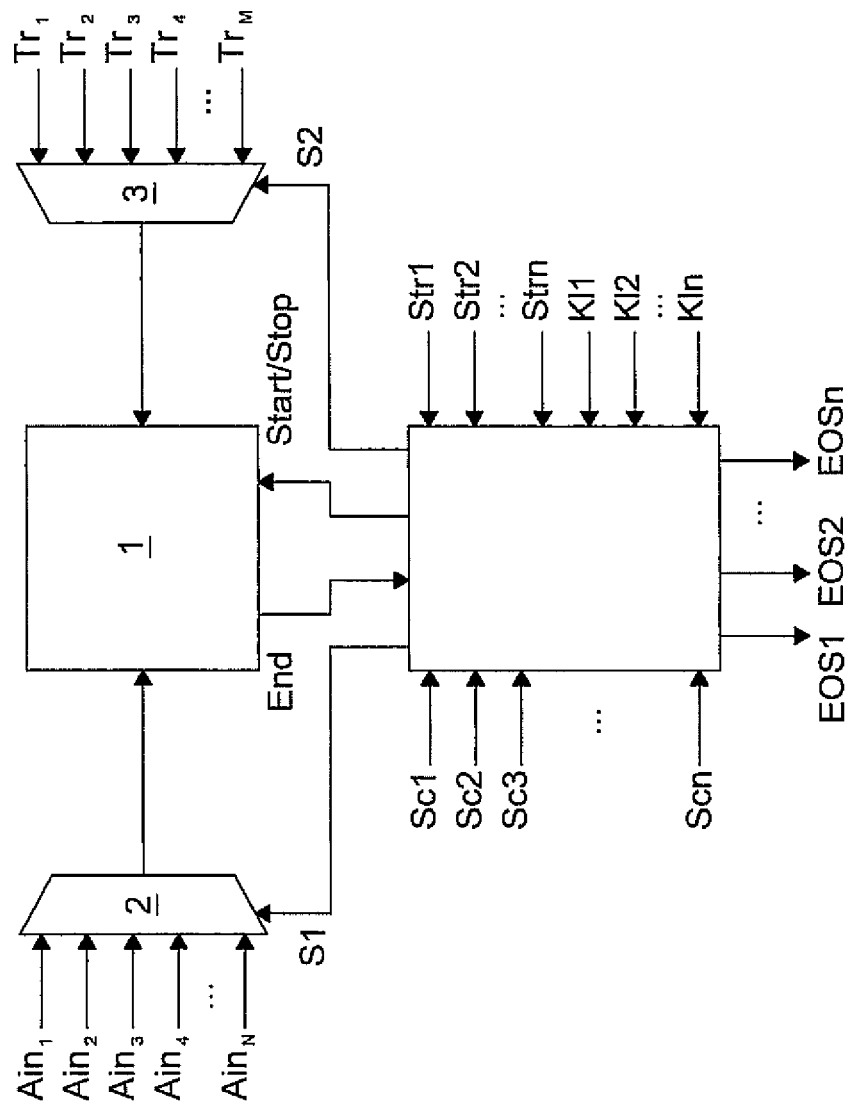
FIG. 1 is a schematic diagram of an analog-to-digital converter apparatus with a sequence arbiter for the analog-to-digital conversions according to the present invention.

The features and advantages of the present invention will become apparent from the following detailed description. FIG. 1 is a schematic diagram of an analog-to-digital converter apparatus according to the present embodiments. The apparatus comprises a conversion circuit 1 able to convert an analog signal into an equivalent digital representation of the analog signal. The analog signal is derived from a multiplexer circuit 2 having a plurality of input terminals to receive a plurality of analog input signals $Ai_{n1} \ldots Ai_{nN}$ and a select input S1. The apparatus also comprises a multiplexer circuit 3 having a plurality of input terminals to receive a plurality of triggering signals $T_{r1} \ldots T_{rM}$ and a select input S2. The conversion circuit 1 starts the conversion of one of the external analog signal $Ai_{n1} \ldots Ai_{nN}$ when the corresponding triggering signal $T_{r1} \ldots T_{rM}$ is received.

The signals $Tr_1 \ldots Tr_M$ are digital signals which assume values "0" (low) or "1" (high), and are derived from a peripheral inside a microcontroller, for example, a timer, or other device external to the microcontroller. The conversion circuit 1 is able to convert an analog signal, selected by the multiplexer circuit 2 in response to the external command S1, to a digital signal corresponding to a rising or falling edge of the selected triggering signal.

The apparatus comprises a sequence arbiter block 10 to manage the conversion process of the conversion circuit 1. The sequence arbiter block 10 receives the conversion sequence configuration signals Sc1 . . . Scn from an external entity for configuring the conversion sequence, the starting signals Str1 . . . Strn for starting the conversion sequence, and the killing or termination signals Kl1 . . . Kln for controlling the end of the conversion sequence. The termination signals Kl1 . . . Kln may be generated by the arbiter block 10. The sequence arbiter block 10 controls the multiplexer circuits 2 and 3 by the select input S1 and S2 to select the analog signal of the plurality of the analog signals which are converted, and the triggering signal. The sequence arbiter block 10 receives an End signal from the circuit 1 which is representative of the end of the single conversion in the conversion sequence and generates properly the signals EOS1, EOS2 . . . EOSn when the relative sequence is completed. The sequence arbiter block 10 is configured to send a control signal Start/Stop to stop the conversion process related to an analog signal belonging to one conversion sequence and to start another conversion process related to another analog signal belonging to another conversion sequence. Therefore the priority of the conversion request is performed by the sequence arbiter block 10 by stopping the actual conversion process related to the analog signal belonging to the first conversion sequence and by simultaneously starting another conversion process related to another analog signal belonging to a second conversion sequence having a higher priority than the first conversion sequence.

The triggering signals $Tr_1 \ldots Tr_M$, the starting signals Str1 . . . Strn, and the termination signals Kl1 . . . Kln are digital signals derived from a microcontroller or other external entity. The sequence arbiter block 10 is sensitive to the falling or rising edge of the starting signals Str1 . . . Strn and the termination signals Kl1 . . . Kln. One of the starting signals Str1 . . . Strn sets the sequence arbiter block 10 to process the start of a new conversion sequence. Considering, for example, the rising edge of a signal as an active edge, a rising edge of one of the starting signals Str1 . . . Strn sets the sequence arbiter block 10 to value the priority of the new conversion sequence to start with respect to the actual conversion sequence, that is, the conversion sequence already in progress. The rising edge of one of the starting signals Str1 . . . Strn also sets the sequence arbiter block 10 to postpone the start of the new conversion sequence putting it in a waiting condition if the actual conversion sequence has a higher priority than the new conversion sequence, or start the new conversion sequence blocking the execution of the actual conversion sequence, and putting it in the waiting condition if the new conversion sequence has a higher priority of the actual conversion sequence. The rising edge of one of the starting signals Str1 . . . Strn also sets the sequence arbiter block 10 to start the new conversion sequence if no conversion sequence is in progress. Starting the new conversion sequence comprises setting the first conversion step of the conversion sequence which waits for the relative triggering signal.

Instead, one of the termination signals Kl1 . . . Kln sets the sequence arbiter block 10 to process the end of a conversion sequence. Considering, for example, the rising edge of a signal as active edge, a rising edge of one of the termination signals Kl1 . . . Kln sets the sequence arbiter block 10 to value the priority of the conversion sequences in a waiting condition and to active the higher priority conversion sequence, and to deactivate the last active conversion sequence if no conversion sequence is in waiting condition. The rising edge of one of the termination signals Kl1 . . . Kln also sets the sequence arbiter block 10 to indicate outside the end of the conversion sequence by one of the end signals EOS1, EOS2, . . . EOSn relative to the completed sequence.

Each one of the conversion sequence configuration signals Sc1 . . . Scn includes a register succession, which comprises, from the beginning to the end of the succession, the following registers:

priority (priority1 . . . priorityn): a register storing the sequence's priority. For example the priority may be represented by a number; a higher priority corresponds to a higher number;

length (length1 . . . lengthn): a register storing the number of conversions constituting the sequence;

pAinBuffer (pAinBuffer1 . . . pAinBuffern): a register storing the pointer to a memory buffer (having size equal to the length) including the selection of the input signals Ain for each conversion in the conversion sequence;

pTrBuffer (pTrBuffer1 . . . pTrBuffern): a register storing the pointer to a memory buffer (having size equal to the length) including the selection of the triggering signals for each conversion in the conversion sequence;

pResults (pResults1 . . . pResultsn) a register storing the pointer to a memory buffer (having size equal to the length) wherein the results of each conversion in the conversion sequence are memorized;

mode (mode1 . . . moden): a register indicating if the conversion sequence is of the single or continuous type; and preferably Str (Str1 . . . Strn): a register storing the selection of one of the signals Str1 . . . Strn which activates the conversion sequence in the case wherein the conversion sequence is not activated by the corresponding signal Str1 . . . Strn; and Kl (Kl1 . . . Kln): a register storing the selection of one of the signals Kl1 . . . Kln which deactivates the conversion sequence in the case wherein the conversion sequence is not deactivated by the corresponding signal Kl1 . . . Kln.

In the case of a single conversion sequence, once the provided conversion number (length) has been executed, the arbiter 10 generates the relative signal Kl to deactivate the sequence, while in the case of continuous conversion sequence, once the provided conversion number (length) has been executed, the conversion sequence starts again. In both cases a relative signal EOS is generated to indicate to the microcontroller the end of the conversion sequence. The microcontroller, based upon a signal EOS, starts the process of the converted data relative to executed conversion sequence because from this instant each new conversion sequence in execution overwrites the preceding results.

When the converter circuit 1 ends an analog-to-digital conversion, it indicates to the arbiter 10 that the last conversion is completed. The sequence arbiter 10 stores the result of the conversion in the memory buffer pointed by the register pResult in the position relative to the executed conversion of the conversion sequence. The sequence arbiter 10 also processes the successive conversion of the conversion sequence, reprogramming the multiplexer circuits 2 and 3 with the values stored in the memory buffers pointed to by the registers pAinBuffer and pTrBuffer to the position relative to the successive conversion. The sequence arbiter 10 further controls if the last conversion of the conversion sequence has been executed, and if so, analyzes the register mode to verify if the conversion sequence is single or continuous. In the case of a single conversion sequence, the arbiter 10 generates the relative signal Kl to deactivate the sequence, while in the case of a continuous conversion sequence, the conversion sequence will start again. In both cases an EOS signal EOS1, EOS2, . . . EOS3 are generated to indicate to the microcontroller the end of the conversion sequence.

Figure 2:
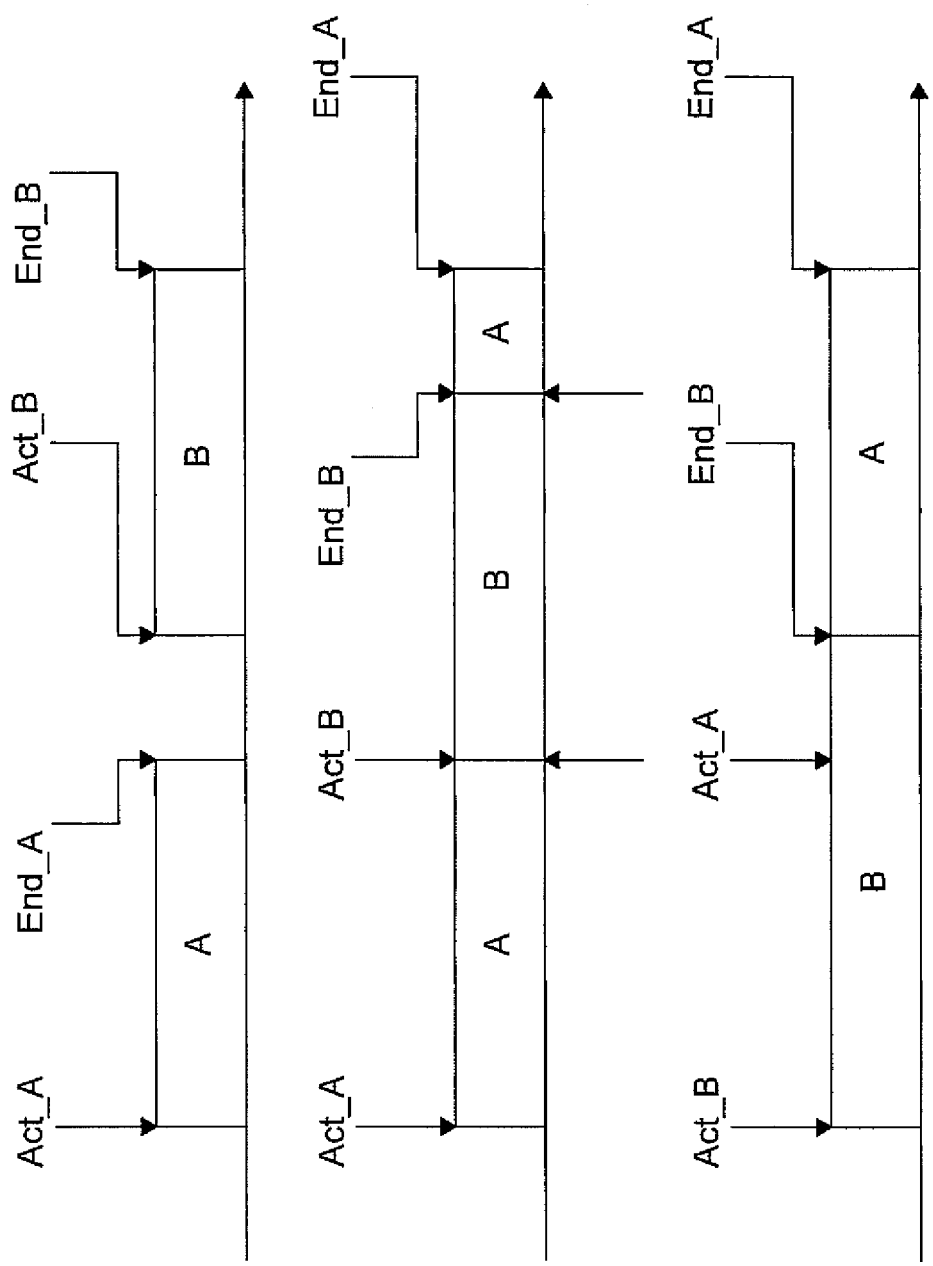
FIG. 2 is a conversion diagram used by the apparatus according to the present invention.

FIG. 2 illustrates, in a more detailed manner the conversion process of the apparatus in FIG. 1. Considering two conversion sequences A and B normally, when the start signal Str1 . . . Strn relative to the conversion sequence A is received by the sequence arbiter block 10, the conversion sequence A is activated (indicated by Act_A) and carried out by the conversion circuit 1. Then, when the start signal Str1 . . . Strn relative to the conversion sequence B is received by the sequence arbiter block 10, and the start signal is received after the end of the conversion sequence A (indicated by End_A), the conversion sequence B is activated (indicated by Act_B) and carried out by the conversion circuit 1 until it is completed (indicated by End_B).

If the start signal relative to the conversion sequence B is received before the conversion sequence A is completed, and if the conversion sequence B has a higher priority than the conversion sequence B, the sequence arbiter block 10 controls the interruption of the conversion sequence A and the start of the conversion sequence B. When the conversion sequence B is completed, the conversion sequence A may be completed if the start signal relative to a new conversion sequence having a higher priority than conversion sequence A is not received by the sequence arbiter block 10.

Instead, if the start signal Str1 . . . Strn relative to the conversion sequence B is received by the sequence arbiter block 10, the conversion sequence B is activated (indicated by Act_B) and carried out by the conversion circuit 1. If a the start signal Str1 . . . Strn relative to the conversion sequence A is received by the sequence arbiter block 10 when the conversion sequence B is not completed, since the conversion sequence B has a higher priority than the conversion sequence A, the conversion sequence B is completed (indicated by End_B) before starting the conversion sequence A. Then the conversion sequence A is carried out by the conversion circuit 1 until it is completed.

Figure 4:
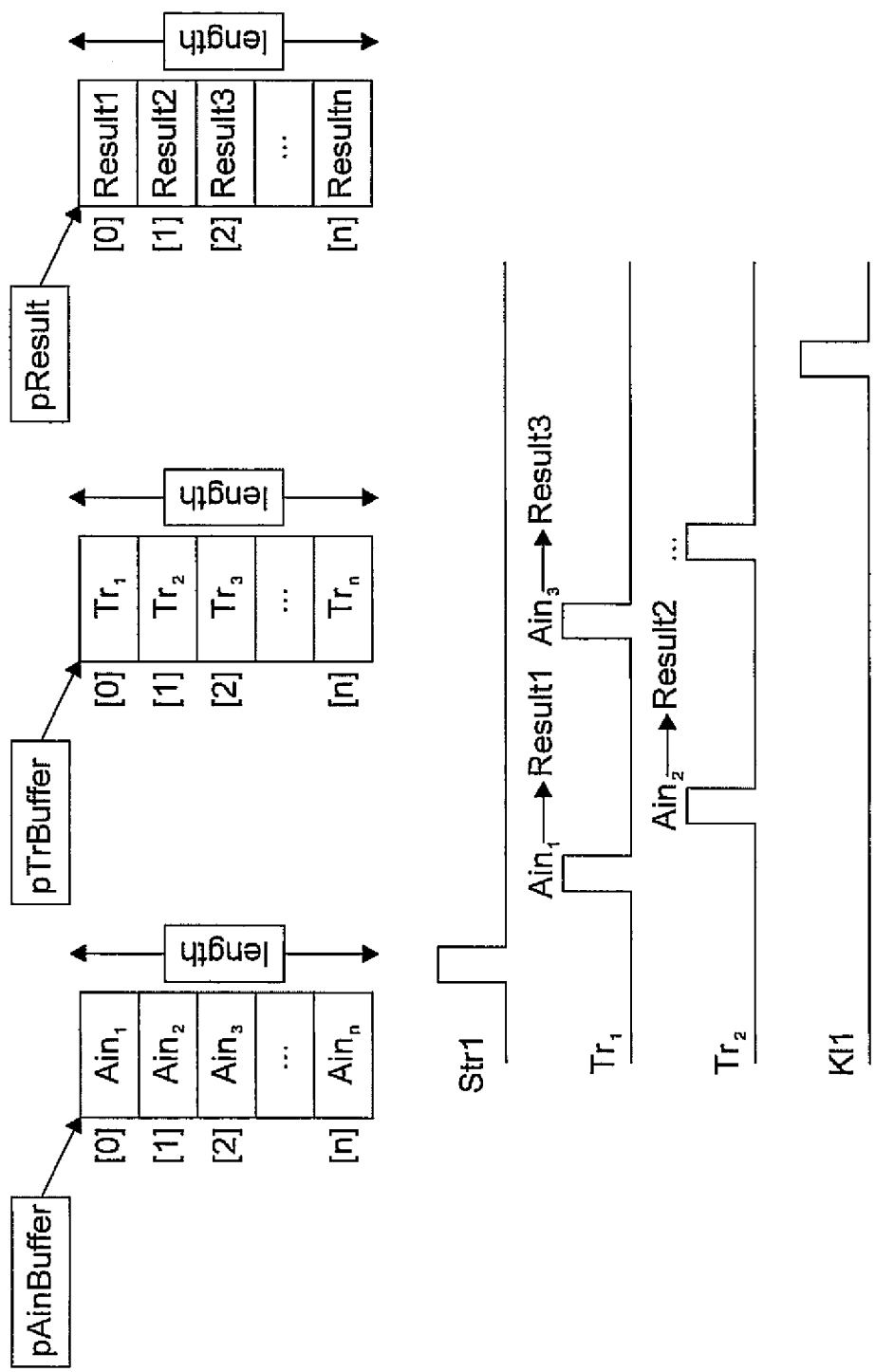
FIG. 4 is an example conversion sequence of the analog-to-digital converter apparatus of FIG. 1.

An example of the conversion sequence is shown in FIG. 4. The conversion sequence is activated by a rising edge of the signal Str1. At this instant the conversion sequence may be activated because other conversion sequences are not active. The arbiter 10 programs the multiplexer 2 and 3 by using the values $Ain_1$ and $Tr_1$ of the first position [0] of the memory buffers pointed to by the registers pAinBuffer and pTrBuffer. The converter circuit 1 waits for a rising edge of the signal $Tr_1$ to convert the analog signal $Ain_1$. Once the first conversion step has been carried out, the result is stored in the first position of the memory buffer pointed to by the register pResult.

The arbiter 10 programs the multiplexer 2 and 3 by using the values $Ain_2$ and $Tr_2$ of the second position [1] of the memory buffers pointed to by the registers pAinBuffer and pTrBuffer. The converter circuit 1 waits for a rising edge of the signal $Tr_2$ to convert the analog signal $Ain_2$. Once the second conversion step has been carried out, the result is stored in the second position of the memory buffer pointed to by the register pResult. The arbiter 10 programs the multiplexer 2 and 3 by using the values $Ain_3$ and $Tr_1$ of the third position [2] of the memory buffers pointed to by the registers pAinBuffer and pTrBuffer. The converter circuit 1 waits for a rising edge of the signal $Tr_1$ to convert the analog signal $Ain_3$. A rising edge of the signals Kl1 deactivates the conversion sequence.

Figure 5:
FIG. 5 is an example sequence arbiter management diagram of the apparatus of FIG. 1.

FIG. 5 illustrates an example of the management of the sequence arbiter 10 when a higher priority sequence (sequence B) is activated during the execution of a lower priority sequence (sequence A). The sequence A is activated by the rising edge of the signal Str2 and becomes effective because other conversion sequences are not in progress. The arbiter 10 programs the multiplexer 2 and 3 by using the values $Ain_1$, Ain2 and $Tr_1$, Tr2 of the first [0] and second [1] positions of the memory buffers pointed to by the registers pAinBuffer1 and pTrBuffer1. Once the first and second conversion steps have been carried out, the results are stored in the first and second positions of the memory buffer pointed to by the register pResult1. Then a rising edge of the signal Str1 activates the conversion sequence B, and the sequence A is suspended. The arbiter 10 programs the multiplexer 2 and 3 by using the values $Ain_4$, $Ain_5$ and $Tr_1$, $Tr_2$ of the first [0] and second [1] positions of the memory buffers pointed to by the registers pAinBuffer2 and pTrBuffer2. Once the first and second conversion steps have been carried out, the results are stored in the first and second positions of the memory buffer pointed to by the register pResult2.

Then an end of sequence signal EOS2 is generated and, since the sequence B is a single sequence, the sequence arbiter 10 sends a killing signal Kl1 to end the sequence B. The suspended sequence A in the waiting condition is activated again. The arbiter 10 programs the multiplexer 2 and 3 by using the value $Ain_3$ and $Tr_1$ of the third [2] position of the memory buffer pointed to by the registers pAinBuffer1 and pTrBuffer1. Once the third conversion step has been carried out, the result is stored in the third position of the memory buffer pointed by the register pResult1.

Then an end of sequence signal EOS1 is generated and, since the sequence A is a continuous sequence, the conversion sequence re-starts by setting the first conversion step relative to the signals $Ain_1$ and $Tr_1$. The results are overwritten on the preceding result, that is, on the first position of the memory buffer pointed to by pResult1. The second conversion step relative to the signals $Ain_2$ and $Tr_2$ has been carried out and so on until an external termination signal Kl2 is received by the sequence arbiter 10.

The analog-to-digital converter apparatus in FIG. 1 may belong to a system provided with a microcontroller coupled by a bus line to the analog-to-digital converter apparatus. The microcontroller may provide the analog input signals $Ain_1 \ldots Ain_N$, and/or the triggering signals $Tr_1 \ldots Tr_M$, and/or the starting signals Str1 . . . Strn, and/or the conversion sequence configuration signals Sc1 . . . Scn.

That which is claimed is:

1. An analog-to-digital converter (ADC) apparatus comprising:
   an input multiplexer circuit having a plurality of analog input terminals configured to receive a plurality of analog input signals, said input multiplexer circuit being responsive to a first select input;
   a trigger multiplexer circuit having a plurality of input terminals configured to receive a plurality of triggering signals, said trigger multiplexer circuit being responsive to a second select input;
   analog-to-digital converter (ADC) circuitry configured to convert a selected one of the plurality of analog input signals into a digital signal; and
   a sequence arbiter coupled to the first and second select inputs and having a plurality of input terminals configured to receive a plurality of conversion sequence configuration signals, said sequence arbiter being configured to
      manage each conversion sequence of the ADC circuitry based upon a relative one of the plurality of conversion sequence configuration signals,
      control interruption of an actual conversion sequence in progress and a start of a new conversion sequence, relative to a new conversion sequence configuration signal, by placing the actual conversion sequence in a waiting condition if the new conversion sequence has a higher priority than the actual conversion sequence, and
      postpone the start of the new conversion sequence by placing it in the waiting condition if the actual conversion sequence has a higher priority than the new conversion sequence.

2. The ADC apparatus according to claim 1, wherein, if the new conversion sequence has a higher priority than the actual conversion sequence, said sequence arbiter is configured to control execution of a remaining part of the actual conversion sequence when the execution of the new conversion sequence is completed and when at least one of no other conversion sequence configuration signal is received, and other conversion sequence configuration signals are received but do not indicate conversion sequences having a higher priority than the actual conversion sequence.

3. The ADC apparatus according to claim 1, further comprising a succession of registers configured to generate each one of the plurality of conversion sequence configuration signals, said succession of registers comprising, from a beginning to an end of the succession:
   a priority register configured to store a priority of conversion sequence;
   a length register configured to store a conversion number constituting the sequence;
   a pointer register configured to store a pointer to a memory buffer, said pointer register having a size equal to a length and including the selected ones of the plurality of analog input signals for each conversion sequence;

a second pointer register configured to store a pointer to a memory buffer including selected ones of the plurality of triggering signals for each conversion sequence;

a third pointer register configured to store a pointer to a memory buffer storing results of each conversion sequence; and a mode register configured to indicate if the conversion sequence is one of a single or a continuous type.

4. The ADC apparatus according to claim 3, wherein the succession of registers of each of the plurality of conversion sequence configuration signals comprises:

a selection register configured to store a selected one of the conversion sequence configuration signals which activates the conversion sequence; and a second selection register configured to store a selected one of a plurality of conversion sequence deactivation signals.

5. The ADC apparatus according to claim 1, wherein said sequence arbiter comprises another plurality of input terminals configured to receive a respective plurality of starting signals, said sequence arbiter being configured to start a conversion sequence based upon each one of the plurality of starting signals.

6. The ADC apparatus according to claim 1, wherein said sequence arbiter comprises a further plurality of input terminals configured to receive a respective plurality of termination signals, said sequence arbiter being configured to end one a conversion sequence based upon each one of the plurality of termination signals.

7. The ADC apparatus according to claim 6, wherein said sequence arbiter is configured to, based upon one of the plurality of termination signals, value the priority of conversion sequences in the waiting condition, and if no conversion sequence is in the waiting condition, said sequence arbiter being configured to one of activate the higher priority conversion sequence and to deactivate the last active conversion sequence, said sequence arbiter also being configured to indicate an outside of an end of a conversion sequence by an end signal relative to a completed sequence.

8. The ADC apparatus according to claim 1, wherein said sequence arbiter is configured to generate a plurality of termination signals, each one of the termination signals being configured to process the end of a conversion sequence.

9. A system comprising:

a microcontroller; and an analog-to-digital (ADC) converter apparatus coupled to said microcontroller and comprising an input multiplexer circuit having a plurality of analog input terminals configured to receive a plurality of analog input signals, said input multiplexer circuit being responsive to a first select input, a trigger multiplexer circuit having a plurality of input terminals configured to receive a plurality of triggering signals, said trigger multiplexer circuit being responsive to a second select input, analog-to-digital converter (ADC) circuitry configured to convert a selected one of the plurality of analog input signals into a digital signal, and a sequence arbiter coupled to the first and second select inputs and having a plurality of input terminals configured to receive a plurality of conversion sequence configuration signals, said sequence arbiter being configured to manage each conversion sequence of the ADC circuitry based upon a relative one of the plurality of conversion sequence configuration signals, control interruption of an actual conversion sequence in progress and a start of a new conversion sequence, relative to a new conversion sequence configuration signal, by placing the actual conversion sequence in a waiting condition if the new conversion sequence has a higher priority than the actual conversion sequence, and postpone the start of the new conversion sequence by placing it in the waiting condition if the actual conversion sequence has a higher priority than the new conversion sequence.

10. The system according to claim 9, wherein, if the new conversion sequence has a higher priority than the actual conversion sequence, said sequence arbiter is configured to control execution of a remaining part of the actual conversion sequence when the execution of the new conversion sequence is completed and when at least one of no other conversion sequence configuration signal is received, and other conversion sequence configuration signals are received but do not indicate conversion sequences having a higher priority than the actual conversion sequence.

11. The system according to claim 9, wherein said ADC converter apparatus comprises a succession of registers configured to generate each one of the plurality of conversion sequence configuration signals, said succession of registers comprising, from a beginning to an end of the succession:

a priority register configured to store a priority of conversion sequence;

a length register configured to store a conversion number constituting the sequence;

a pointer register configured to store a pointer to a memory buffer, said pointer register having a size equal to a length and including the selected ones of the plurality of analog input signals for each conversion sequence;

a second pointer register configured to store a pointer to a memory buffer including selected ones of the plurality of triggering signals for each conversion sequence;

a third pointer register configured to store a pointer to a memory buffer storing results of each conversion sequence; and a mode register configured to indicate if the conversion sequence is one of a single or a continuous type.

12. The system according to claim 11, wherein the succession of registers of each of the plurality of conversion sequence configuration signals comprises:

a selection register configured to store a selected one of the conversion sequence configuration signals which activates the conversion sequence; and a second selection register configured to store a selected one of a plurality of conversion sequence deactivation signals.

13. The system according to claim 9, wherein said sequence arbiter comprises another plurality of input terminals configured to receive a respective plurality of starting signals, said sequence arbiter being configured to start a conversion sequence based upon each one of the plurality of starting signals.

14. The system according to claim 9, wherein said sequence arbiter comprises a further plurality of input terminals configured to receive a respective plurality of termination signals, said sequence arbiter being configured to end one a conversion sequence based upon each one of the plurality of termination signals.

15. The system according to claim 9, wherein said sequence arbiter is configured to generate a plurality of termination signals, each one of the termination signals being configured to process the end of a conversion sequence.

16. A method of operating an analog-to-digital converter (ADC) apparatus comprising:
- receiving one of a plurality of conversion sequence configuration signals;
- determining if a priority of a new conversion sequence relative to a given one of the plurality of received conversion sequence configuration signals is one of higher and lower than an actual conversion sequence in progress;
- if the new conversion sequence has a higher priority than the actual conversion sequence in progress, controlling interruption of the actual conversion sequence and a start of the new conversion sequence by placing a preceding conversion sequence in a waiting condition, while if the actual conversion sequence has a higher priority than the new conversion sequence, postponing a start of the new conversion sequence by putting it in the waiting condition; and
- managing each conversion sequence performed by analog-to-digital converter (ADC) circuitry based upon a relative one of the plurality of conversion sequence configuration signals, until the conversion sequence is completed, by at least
    - selecting an analog signal from a plurality of analog input signals,
    - selecting a triggering signal from a plurality of triggering signals, and
    - performing a conversion of the selected analog signal into a digital signal.

17. The method according to claim 16, further comprising, if the new conversion sequence has a higher priority than the actual conversion sequence, controlling execution of a remaining part of the actual conversion sequence when execution of the new conversion sequence is completed and when one of no other conversion sequence configuration signal is received and other conversion sequence configuration signals are received but do not indicate conversion sequences having a higher priority than the actual conversion sequence.

18. The method according to claim 16, further comprising:
- one of receiving one of a plurality of termination signals and generating a termination signal;
- valuing a priority of conversion sequences in the waiting condition and one of activating a higher priority conversion sequence and deactivating a last active conversion sequence if no conversion sequence is in waiting condition; and
- indicating an end of the conversion sequence by an end signal relative to a completed sequence.

* * * * *